(12) United States Patent
Farooq et al.

(10) Patent No.: US 9,047,938 B2
(45) Date of Patent: Jun. 2, 2015

(54) PHASE CHANGE MEMORY MANAGEMENT

(71) Applicant: International Business Machines Corporation, Armonk, NY (US)

(72) Inventors: Mukta G. Farooq, Hopewell Junction, NY (US); Eren Kursun, Ossining, NY (US); Gary W. Maier, Poughkeepsie, NY (US); Bipin Rajendran, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 151 days.

(21) Appl. No.: 13/775,281

(22) Filed: Feb. 25, 2013

(65) Prior Publication Data

US 2014/0241048 A1   Aug. 28, 2014

(51) Int. Cl.
*G11C 7/00* (2006.01)
*G11C 13/00* (2006.01)
*G11C 7/04* (2006.01)

(52) U.S. Cl.
CPC .............. *G11C 13/0004* (2013.01); *G11C 7/04* (2013.01); *G11C 13/0069* (2013.01); *G11C 2213/71* (2013.01)

(58) Field of Classification Search
CPC ....................... G11C 13/0069; G11C 13/0004
USPC .................................................. 365/163, 148
See application file for complete search history.

(56) References Cited

U.S. PATENT DOCUMENTS

| | | | |
|---|---|---|---|
| 7,005,665 B2 | 2/2006 | Furkay et al. | |
| 7,327,623 B2 | 2/2008 | Happ et al. | |
| 7,548,451 B2 * | 6/2009 | Oh et al. | 365/163 |
| 7,623,401 B2 * | 11/2009 | Philipp et al. | 365/222 |
| 7,732,798 B2 * | 6/2010 | Elmegreen et al. | 257/2 |
| 7,768,016 B2 * | 8/2010 | Kreupl | 257/76 |
| 7,817,465 B2 * | 10/2010 | Oh et al. | 365/163 |
| 7,855,909 B1 | 12/2010 | Sutardja | |
| 7,876,605 B2 | 1/2011 | Bolivar et al. | |
| 7,883,930 B2 | 2/2011 | Tsukamoto et al. | |
| 8,132,063 B2 * | 3/2012 | Terao et al. | 714/721 |
| 8,134,866 B2 * | 3/2012 | Bae et al. | 365/163 |
| 8,320,171 B2 * | 11/2012 | Park | 365/163 |
| 2006/0203541 A1 | 9/2006 | Toda | |

(Continued)

OTHER PUBLICATIONS

"Exploring Phase Change Memory and 3D Die-Stacking for Power/Thermal Friendly, Fast and Durable Memory Architectures", Zhang, et al., IEEE 2009 18th International Conference on Parallel Architectures and Compilation Techniques pp. 110-112.
"Real-Time Scheduling for Phase Change Main Memory Systems", Zhou, et al., IEEE, Nov. 2011 pp. 991-998.
International Search Report/Written Opinion, PCT/US2014/014996; May 20, 2014.

(Continued)

*Primary Examiner* — Michael Tran
(74) *Attorney, Agent, or Firm* — Ira D. Blecker; Steven J. Heyers

(57) ABSTRACT

A three dimensional (3D) stack of phase change memory (PCM) devices which includes PCM devices stacked in a 3D array, the PCM devices having memory regions; a memory management unit on at least one of the PCM devices; a stack controller in the memory management unit to monitor an ambient device temperature ($T_{ambient}$) with respect to a neighborhood of memory regions in the PCM devices and to adjust a programming current with respect to at least one of the memory regions in the neighborhood of memory regions in accordance with the $T_{ambient}$. Also disclosed is a method of programming a PCM device.

19 Claims, 5 Drawing Sheets

(56) References Cited

U.S. PATENT DOCUMENTS

| | | |
|---|---|---|
| 2009/0072213 A1 | 3/2009 | Elmegreen et al. |
| 2010/0163817 A1 | 7/2010 | Savransky et al. |
| 2010/0297824 A1 | 11/2010 | Lung |
| 2011/0215288 A1 | 9/2011 | Matsui et al. |
| 2013/0001502 A1 | 1/2013 | Jung et al. |

OTHER PUBLICATIONS

B. Rajendran et al., "Analytical Model for RESET Operation of Phase Change Memory", Electron Devices Meeting, IEDM 2008, IEEE International, Dec. 15-17, 2008, 4 pages.

\* cited by examiner

PHASE CHANGE MEMORY MANAGEMENT

BACKGROUND

The present invention relates to phase change memory, and more particularly, relates to methods and apparatus for controlling the programming of the phase change memory.

Phase change memory uses a thermal process in which a special material, such as a chalcoginide glass, is switched between amorphous and crystalline states. The crystalline and amorphous states of chalcogenide glass have dramatically different electrical resistivity. The amorphous, high resistance state may represent a binary 0, while the crystalline, low resistance state may represent a 1. Phase change memory may be programmed by applying a current which causes the phase change memory to heat and change state. If the phase change memory is heated to the melting temperature of the phase change material, it will become amorphous while if it is heated to a lower, crystallizing temperature, it will become crystalline. The melting temperature and crystallization temperature are material dependent.

Phase change memory (PCM) is an emerging storage class memory technology. Three dimensional (3D) PCM stacks have been demonstrated in order to increase the storage capacity and improve access latency per footprint area but data retention due to the resistance loss in the amorphous phase of the material is considered to be an important challenge in phase change memory technologies. This wear out mechanism must be managed to extend the lifetime of the PCM. This challenge becomes more prominent in stacked environments where multiple cells are in close proximity which increase localized heat and propagation to adjacent areas.

BRIEF SUMMARY

The various advantages and purposes of the exemplary embodiments as described herein are achieved by providing, according to a first aspect of the exemplary embodiments, a three dimensional (3D) stack of phase change memory (PCM) devices which includes a plurality of PCM devices stacked in a 3D array, the plurality of PCM devices having a plurality of memory regions; a memory management unit on at least one of the PCM devices; a stack controller in the memory management unit to monitor an ambient device temperature ($T_{ambient}$) with respect to a neighborhood of memory regions in the PCM devices and to adjust a programming current with respect to at least one of the memory regions in the neighborhood of memory regions in accordance with the $T_{ambient}$.

According to a second aspect of the exemplary embodiments, there is provided a three dimensional (3D) stack of phase change memory (PCM) devices which includes a plurality of PCM devices stacked in a 3D array, the plurality of PCM devices having a plurality of memory regions; a plurality of temperature sensors associated with the plurality of memory regions; a memory management unit on at least one of the PCM devices to program the plurality of memory regions; a stack controller in the memory management unit to monitor an ambient device temperature ($T_{ambient}$) provided by at least one of the temperature sensors associated with one of the plurality of memory regions and to adjust a programming current in the memory management unit with respect to the one of the plurality of memory regions in accordance with the $T_{ambient}$ provided by the at least one of the temperature sensors.

According to a third exemplary embodiment, there is provided a phase change memory (PCM) device which includes a PCM device having a plurality of memory regions; a memory management unit on the PCM device; a stack controller in the memory management unit to monitor an ambient device temperature ($T_{ambient}$) with respect to a neighborhood of memory regions in the PCM device and to adjust a programming current with respect to at least one of the memory regions in the neighborhood of memory regions in accordance with the $T_{ambient}$.

According to a fourth exemplary embodiment, there is provided a method of programming a phase change memory (PCM) device within a three dimensional (3D) stack of PCM devices having a stack controller which includes monitoring an ambient device temperature ($T_{ambient}$) by the stack controller in a first PCM device; monitoring $T_{ambient}$ by the stack controller in second PCM devices, the second PCM devices being neighbors of the first PCM device; programming by the stack controller one of the second PCM devices having $T_{ambient}$ higher than the $T_{ambient}$ of the first PCM device such that a programming current is adjusted according to the $T_{ambient}$ of the one of the second PCM devices. The method may be performed by one or more computing devices.

According to a fifth aspect of the exemplary embodiments, there is provided a method of programming a phase change memory (PCM) device within a three dimensional (3D) stack of PCM devices having a stack controller which includes monitoring by the stack controller an ambient device temperature ($T_{ambient}$) in a first PCM device; determining a thermal efficiency metric (TEM) for the first PCM device, wherein the thermal efficiency metric is proportional to $T_{melt}-T_{ambient}$ where $T_{melt}$ is the temperature at which a material comprising the PCM device converts from crystalline to amorphous; monitoring by the stack controller $T_{ambient}$ in second PCM devices, the second PCM devices being neighbors of the first PCM device; determining a heat flow path for the second PCM devices, wherein the heat flow path is the direction of heat flow among the second PCM devices; determining a TEM for each of the second PCM devices in the heat flow path; choosing one of the second PCM devices having a TEM less than the TEM of the first PCM device; programming by the stack controller the one of the second PCM devices such that a programming current is adjusted according to the TEM of the one of the second PCM devices. The method may be performed by one or more computing devices.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION

The exemplary embodiments provide a technique that improves the retention characteristics and extends the life time of the PCM by leveraging and carefully managing the thermal profile of the 3D stack. PCM may be currently used for non-volatile storage application. However, PCM provides promising characteristics for main memory use if properly implemented by harvesting heat generated by the PCM devices and by managing wear leveling to avoid wear out of the PCM devices.

The proposed technique starts with four fundamental observations. (1) In 3D stacked memories the close proximity of memory layers creates more localized heat to active memory regions during writes and for natural heat flow patterns through the stack. (2) For higher ambient temperatures, programming temperatures can be achieved with lower programming current values. (3) During application studies of PCM main memory use, it has been determined that the distribution of writes may be highly skewed. Approximately 70% of the writes are written to 1% of the pages and 90% of the writes are directed to 20% of the pages. Most of the pages are primarily read only. This behavior quickly wears out bit cells. (4) High overhead software algorithms have been proposed to exercise wear leveling (WL) where page tables are managed to swap pages to different physical memory segments during write backs to the main memory. This strategy has extended PCM life time from days to many years and allowed PCM for main memory use.

The combination of these fundamental observations is leveraged by the exemplary embodiments which monitor the memory segment temperatures in a stack to both optimize the heat generation/reuse to reduce the write current profile requirements of the neighbor layer/regions and also implement WL by thermal mapping physical memory segments for high write back activity and managing page swapping using the controller hardware to level writes evenly across the memory stack. The stack thermal management leverages highly effective methods for extending the lifetime of PCM more efficiently by reducing bit cell wear. Optimizing stack thermal management reduces write currents and at the same time drastically reduces the software overhead currently proposed for page management schemes that require separate tag memories, segment and global counters, and long search routines for Least Recently Used (LRU) segments.

According to the exemplary embodiments, a new PCM stack controller structure is proposed. The stack controller coordinates the regional activity vertically and horizontally through the stack such that the heat generation due to high activity in one region is leveraged to reduce the write current of the region immediately below or adjacent to the one region on the path to a substrate, such as a heat sink.

Figure 1:
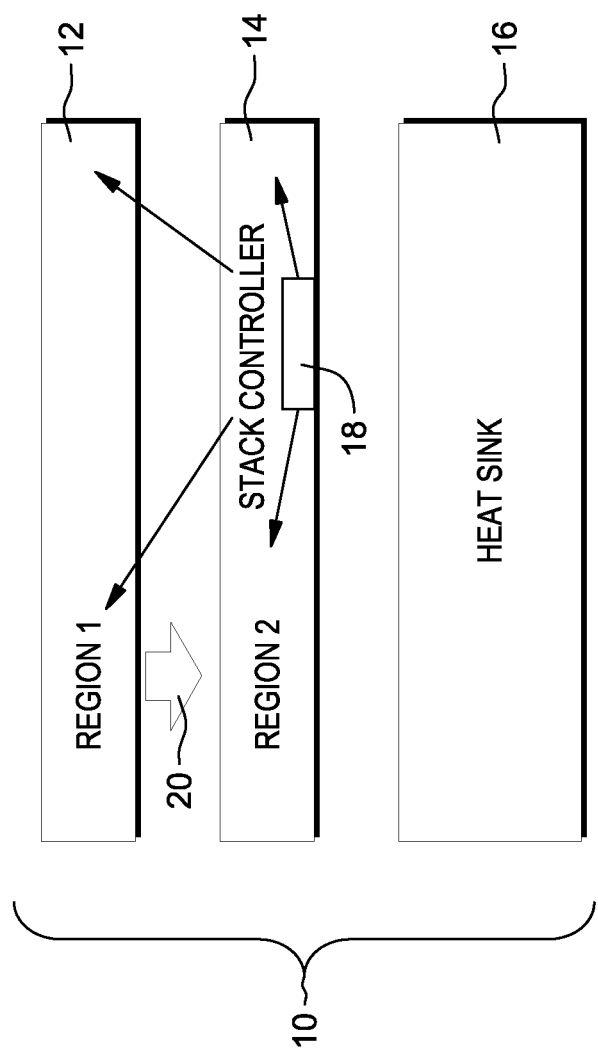
FIG. 1 is an illustration of a three dimensional stack of PCM.

Referring to the Figures in more detail, and particularly referring to FIG. 1, there is illustrated a stack 10 of PCM chips 12, 14 on a substrate such as a heat sink 16. At least one PCM chip 14 contains a stack controller 18. The stack controller 18 monitors the heat generated from programming of nearby regions of the PCM chips 12, 14. While only one stack controller 18 in PCM chip 14 is shown in FIG. 1, there may be more than one stack controller 18 in PCM chip 14. In addition, while there are a stack of PCM chips 12, 14 shown in FIG. 1, the exemplary embodiments may have applicability when there is only one PCM chip, for example PCM chip 14 on substrate 16.

PCM chip 12 contains region 1 of memory and PCM chip 14 contains region 2 of memory. A region of memory is a group of memory cells and may be less than the entire PCM chip. Programming of the regions of the PCM chips 12, 14 is understood to be thermally converting regions of the PCM chip from the amorphous state to the crystalline state and vice versa by applying a current to the PCM chip region (or regions) that is being programmed. Sufficient current is needed to raise the temperature of the PCM chip region from an ambient temperature to a temperature which causes the PCM chip region to undergo the transformation from one state to the other. During a programming operation, region 1 of PCM chip 12 may be programmed which may generate heat due to the current applied to region 1. Heat generated from the programming of region 1 may flow, indicated by arrow 20, towards region 2. The heat flowing towards region 2 may be harvested to reduce the amount of current needed for programming of region 2. The stack controller also coordinates regional activity throughout the stack 10 to maximize the heat harvesting from neighboring regions to minimize the write current.

The write current may be also throttled by the stack controller 18 (increased or decreased) depending on the targeted region temperature. This dynamic current adjustment guarantees a minimum current to change states while throttling current up and down to maximize retention, reliability, and the life of the cell as the temperature may vary from region to region.

While programming multiple PCM memory regions in multiple layers, such as regions 1 and 2 shown in FIG. 1, it is beneficial to program the PCM memory regions sequentially from top to bottom in a vertical cross section. Heat generated during programming of the top layer diffuses downwardly to the substrate, such as heat sink 16, raising the temperature of the lower PCM memory regions. This local rise in ambient temperature for the lower PCM memory regions can then be harvested to lower the programming power of devices in the lower PCM memory regions.

The stack controller 18 may be placed within the memory management unit of one of the PCM chips, for example PCM chip 14. The stack controller operates in the following manner. A Thermal Efficiency Metric (TEM) may be calculated. TEM is equal to the temperature difference between the ambient temperature ($T_{ambient}$) and the conversion temperature of the PCM material at which the PCM material will convert from amorphous to crystalline and crystalline to amorphous, known as the melt temperature ($T_{melt}$), with $T_{melt}$ for amorphizing being higher than $T_{melt}$ for crystallizing The programming current may be calculated according to the following equation:

$$I^2 \rho_m = K_s 2\pi x_0^2 (T_{melt} - T_{ambient}) \int \left[\frac{x_o}{a}\right]$$

Thus, in this equation, it can be seen that the programming current ($I^2 \rho_m$) is proportional to ($T_{melt} - T_{ambient}$).

TEM may be pre-simulated for each design based on design and stack configuration, expected power and thermal density, and gradients. Other design parameters may be considered and used in the simulations such as cell dimensions and density, etc. TEM is actually a $T_{melt} - T_{ambient}$ delta for each design and technology. Each design and/or design application will have its own metric to be used in the controller programming algorithms. While $T_{melt}$ of the chosen material would likely be close to an optimal fixed value, it may vary slightly for each cell and stack design. Thus a TEM should be calculated for varying design parameters and re-simulated to establish the correct $T_{melt}-T_{ambient}$ delta. The TEM delta may also be adjusted to maximize performance and/or reduce power while sacrificing life expectancy. For example, a mobile designer may allow for longer cell programming time to gain low power. Thus, this example application may require very low programming currents. The metric TEM for this design is simulated during the design phase based on layout, stack configuration, wire and cell size and density, etc. and a different $T_{melt}-T_{ambient}$ delta may be established. TEM may also be field adjusted by loading new algorithms as the application environments and requirements change. The designer may then calculate a different TEM by allowing a larger or smaller $T_{melt}-T_{ambient}$ delta as an example.

In terms of writing efficiency, the smallest TEM is desirable representing the smallest $(T_{melt}-T_{ambient})$, thus requiring the smallest write current. In an alternative embodiment, safe PCM memory cell WL temperature limits may be determined for each memory configuration. The TEM and WL limits are loaded into the stack controller. The PCM stack controller monitors the temperature of the PCM memory regions and calculates the heat flow direction in a 3D stack of PCM chips. The stack controller recalculates the TEM for each memory region and reassigns tasks to new regions having a higher TEM until a task list is exhausted. Heat may be harvested from adjacent memory regions both horizontally within the same PCM chip and vertically between different PCM chips. The PCM stack controller manages the write currents and steers writes to alternative memory regions.

In the alternative exemplary embodiment, the writes may be determined within a set of wear leveling limits between predetermined high temperature and low temperature limits. In this alternative exemplary embodiment, if wear leveling limits are exceeded, the stack controller may move writes to the nearest memory region of cells in Partial Recently Used (PRU) segments or Least Recently Used (LRU) segments (whichever is available) with the warmest temperature to maximize lower write currents. That is, the stack controller looks for a memory region with the warmest cells to write to next but the memory region should not be so warm as to exceed the wear leveling limits. The Most Recently Used (MRU) segments, if too warm, may be disabled and then later reset when they reach the acceptable WL low limit. This write management balances write currents by harvesting heat for warm neighboring cells but balances the whole memory system for an even number of writes by monitoring MRU, PRU, and LRU segments using temperature as a measure of activity.

The exemplary embodiments may utilize a WL page swapping technique which may be implemented using a thermal to physical segment mapping table that does not require segment or global counters and large overhead software search algorithms to monitor and track memory segment activity. The controller maintains a memory task list by tagging and sorting the MRU, PRU and LRU segments in a thermal mapping table. The stack controller also provides a global hardware/stack profile. For each memory segment assignment, it scans neighborhood regions in the stack for activity and heat flow direction profiles. For each pair of regions a heat flow metric and direction can be determined, which in turn is used to calculate the efficiency of the assignment with respect to alternative assignment options with different heat flow and reuse characteristics. The stack controller then selects the most efficient assignment option according to the proposed metric evaluation and then manages writes by comparisons to the thermal map table which profiles the MRU, PRU and LRU segments. By leveraging the heat from neighboring regions the programming temperature can be achieved with lower current, which in turn improves the retention and energy efficiency characteristics of the stack. Additionally the stack controller takes advantage of this stack thermal profile to automatically steer page swapping to PRU and LRU physical segments which levels bit cell wear out. By implementing both of these thermal controller techniques, the lifetime of the PCM is extended to allow very large main memories be implemented in 3D stacks in a very efficient manner and further reduce system power consumption and wear out mechanisms.

Figure 2:
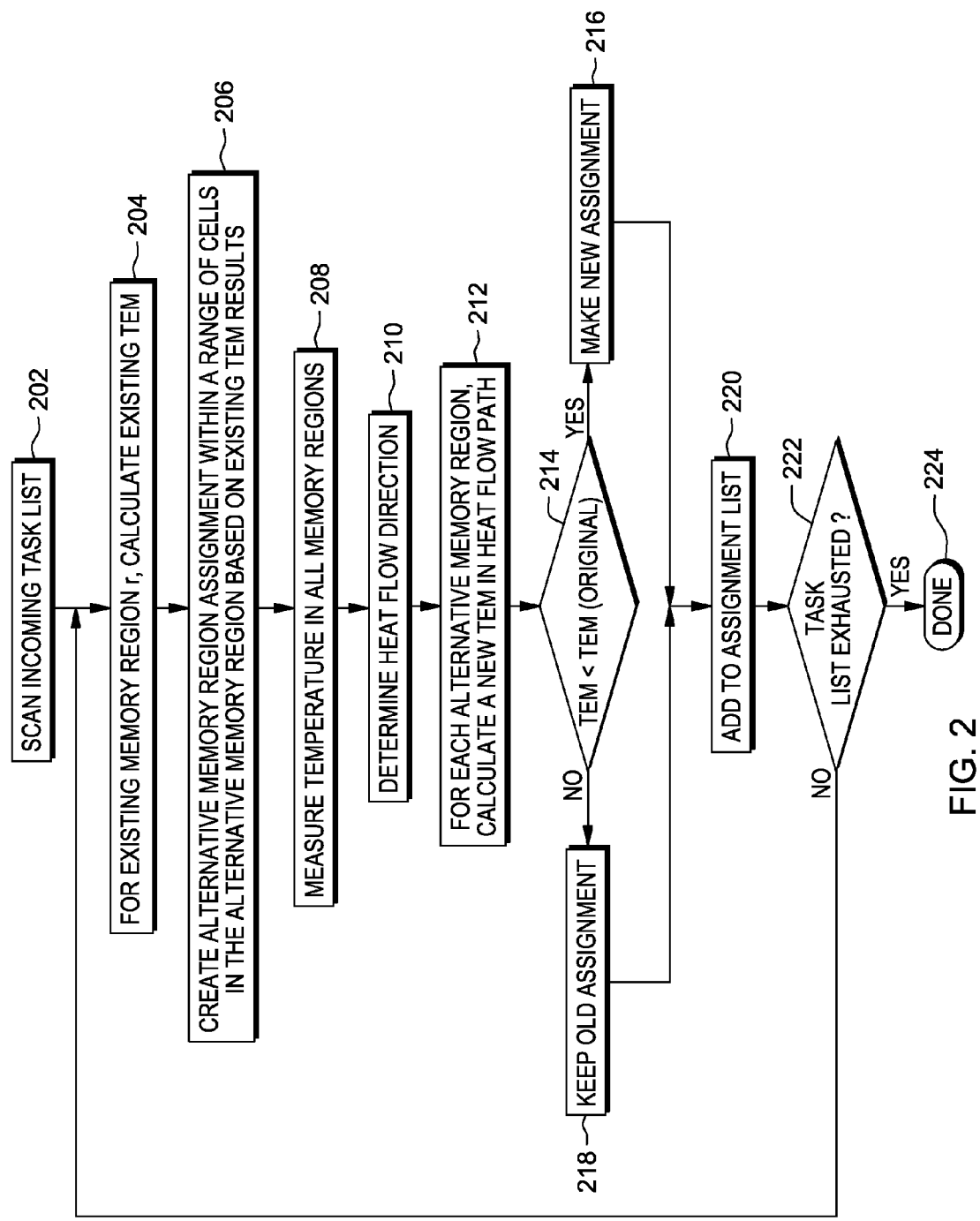
FIG. 2 is a flow chart illustrating a first exemplary method of programming a PCM memory region.

Referring now to FIG. 2, there is illustrated a first method flow for minimizing write currents according to a first exemplary embodiment. An incoming task list of memory regions to be programmed is first scanned, box 202.

For a first existing memory region, r, the TEM is calculated, box 204, as discussed previously.

It is desirable to program the next memory region using the heat generated from memory region r. The stack controller looks for other memory regions and creates an alternative memory region assignment in at least one memory region other than memory region r, box 206. Usually, there will be several possible alternative memory regions for assignment.

The memory regions shown in FIG. 1 may have a temperature sensor associated with the memory regions as explained in more detail hereafter. Temperatures are sensed from the alternative memory regions, box 208, and from the sensed temperatures, the stack controller determines the heat flow direction, box 210, such as heat flow direction 20 shown in FIG. 1.

Then, for each alternative memory region, a new TEM is calculated in the heat flow path, box 212. Memory regions in the heat flow path are desirable so as to best obtain the advantages of elevated temperatures to reduce the current necessary for programming.

According to the process flow, the TEM of the original memory region r is compared with the TEM for an alternative memory region, decision box 214. If the TEM for the alternative memory region is less than the TEM of the original memory region r, meaning that $T_{ambient}$ is higher for the alternative memory region than for the original memory region r, then the alternative memory region may be assigned to receive data that would have been formerly assigned to memory region r, box 216.

If the TEM for the alternative memory region is more than the TEM of the original memory region r, meaning that $T_{ambient}$ is lower for the alternative memory region than for the original memory region r, then the original memory region assignment is kept, box 218.

There may be more than one alternative memory region having a TEM less than the original TEM for memory region r. The user may define additional algorithms to deal with this situation. In one exemplary embodiment, the decision may be made to choose the first alternative memory region that meets the test of having a TEM less than the original TEM for memory region r. In another exemplary embodiment, the user may test each of the alternative memory regions until the warmest alternative memory region (smallest TEM) is found that meets the test of having a TEM less than the original TEM for memory region r. The latter exemplary embodiment may be implemented by inserting another decision box between decision box 214 and the new assignment box 216 to test each alternative memory region until the warmest alternative memory region is found. In another exemplary embodiment, the algorithm may include choosing the closest alternative memory region of alternative memory regions that meet the test of having a TEM less than the original TEM for memory region r. In yet another alternative exemplary embodiment, the algorithm may look for those warm alternative memory regions having the best linear heat flow directional path up and down a 3D PCM stack.

Whether the old memory region assignment is kept, box 218, or a new memory region assignment is made, box 216, the memory assignment is added to an assignment list, box 220.

Next, it is determined if there are any more tasks in the task list, decision box 222. This may be easily accomplished by a counter (not shown) which may decrement until all tasks in the task list have been dealt with. If there are no more tasks in the task list, the task list is exhausted, and the process flow is done, box 224. If there are more tasks in the task list, the process flow proceeds back to box 204 and the next task is selected for memory assignment.

Figure 3:
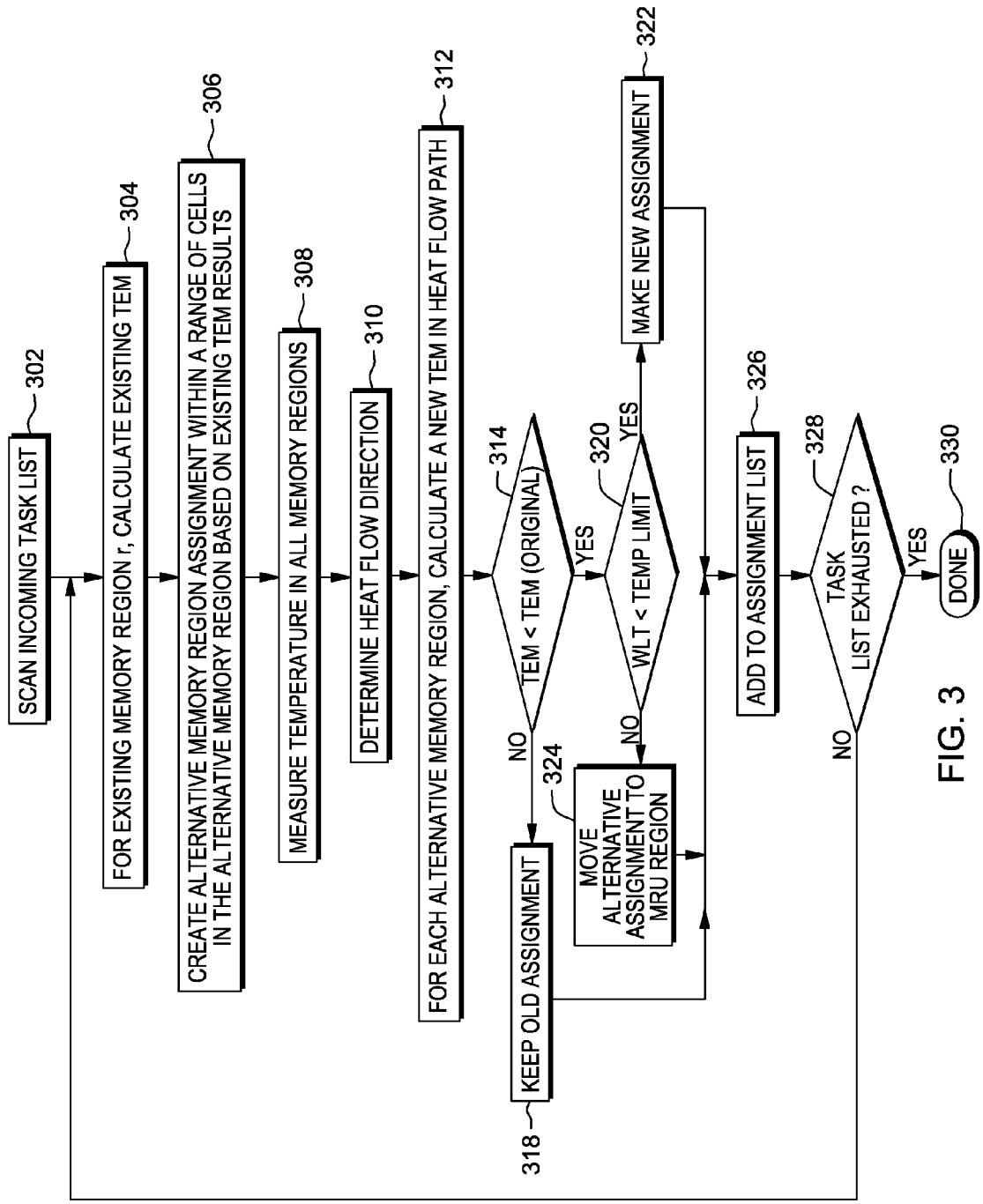
FIG. 3 is a flow chart illustrating a second exemplary method of programming a PCM memory region.

Referring now to FIG. 3, there is illustrated a second method flow for minimizing write currents with wear leveling according to a second exemplary embodiment.

The second method flow as illustrated in boxes 302, 304, 306, 308, 310, 312, 314 and 318 is identical to that described with respect to the first method flow. The second method flow illustrated in FIG. 3 however further includes additional process details for handling wear leveling.

If it is determined in decision block 314 that the TEM of the alternative memory region is less than the original TEM of memory region r, the process flow proceeds to decision block 320 to determine if the temperature of the alternative memory region is less than the Wear Leveling (WL) temperature limit. That is, an alternative memory region may have a sufficient temperature to satisfy the TEM requirement so that the programming current may be reduced, but the alternative memory region may have too high a temperature indicating that it is an MRU segment, requiring that the memory assignment occur elsewhere to reduce wear leveling. If the temperature of the alternative memory region is less than the WL temperature, then a new assignment to the alternative memory region is done, box 322. If the temperature of the alternative memory region is greater than the WL temperature, then the original assignment is kept and the alternative memory region is marked as an MRU segment, box 324.

However, it should be understood that LRU and MRU tags may be used for other things such as parallel processes looking to allocate memory space. The MMU can handle many tasks in parallel and would also want to quickly allocate an available block of memory with the most optimal conditions for wear leveling. The exemplary embodiments are meant to coexist with the traditional MMU parallel memory management tasks and add enhanced features to utilize temperature awareness to the MMU functions.

Whether the old memory region assignment is kept, box 318 and box 324, or a new memory region assignment is made, box 322, the memory assignment is added to an assignment list, box 326.

Next, it is determined if there are any more tasks in the task list, decision box 328. This may be easily accomplished by a counter (not shown) which may decrement until all tasks in the task list have been dealt with. If there are no more tasks in the task list, the task list is exhausted, and the process flow is done, box 330. If there are more tasks in the task list, the process flow proceeds back to box 304 and the next task is selected for memory assignment.

Figure 4:
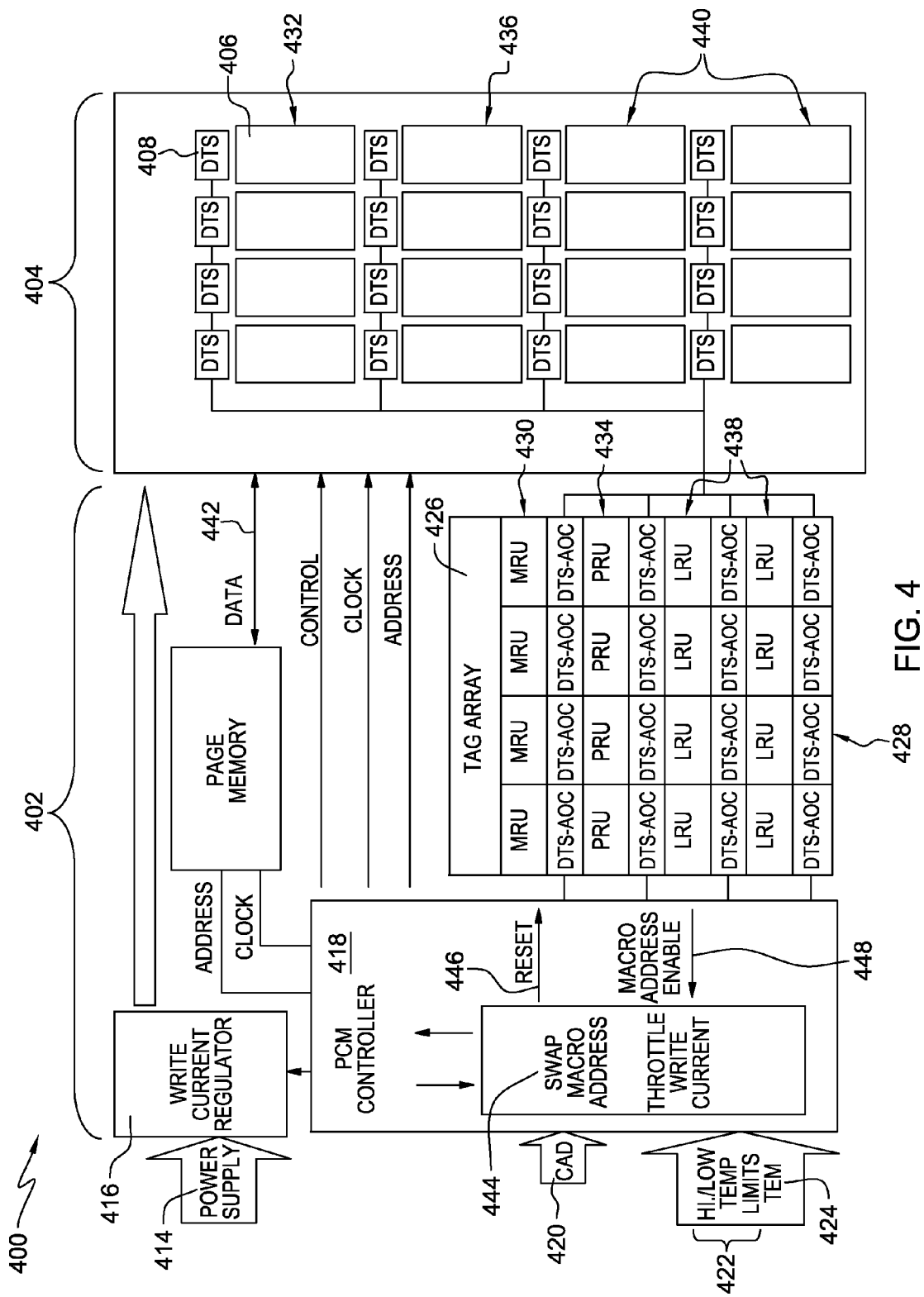
FIG. 4 is an illustration of a hardware environment having PCM devices.

Referring now to FIG. 4, there is illustrated a hardware environment 400 for the exemplary embodiments. Hardware environment 400 is a PCM chip having an MMU 402 and PCM memory macros 404, representing regions 406 of PCM memory. Regions 406 may also be referred to herein as segments. As shown in FIG. 4, there are, for purposes of illustration and not limitation, 16 memory regions 406 and it should be understood that there may be more or less than 16 memory regions 406 in a given hardware environment 400. Each memory region 406 may be associated with a temperature sensor 408 which, for purposes of illustration and not limitation, may be a digital temperature sensor including a thermal diode and an AC/DC converter.

Figure 5:
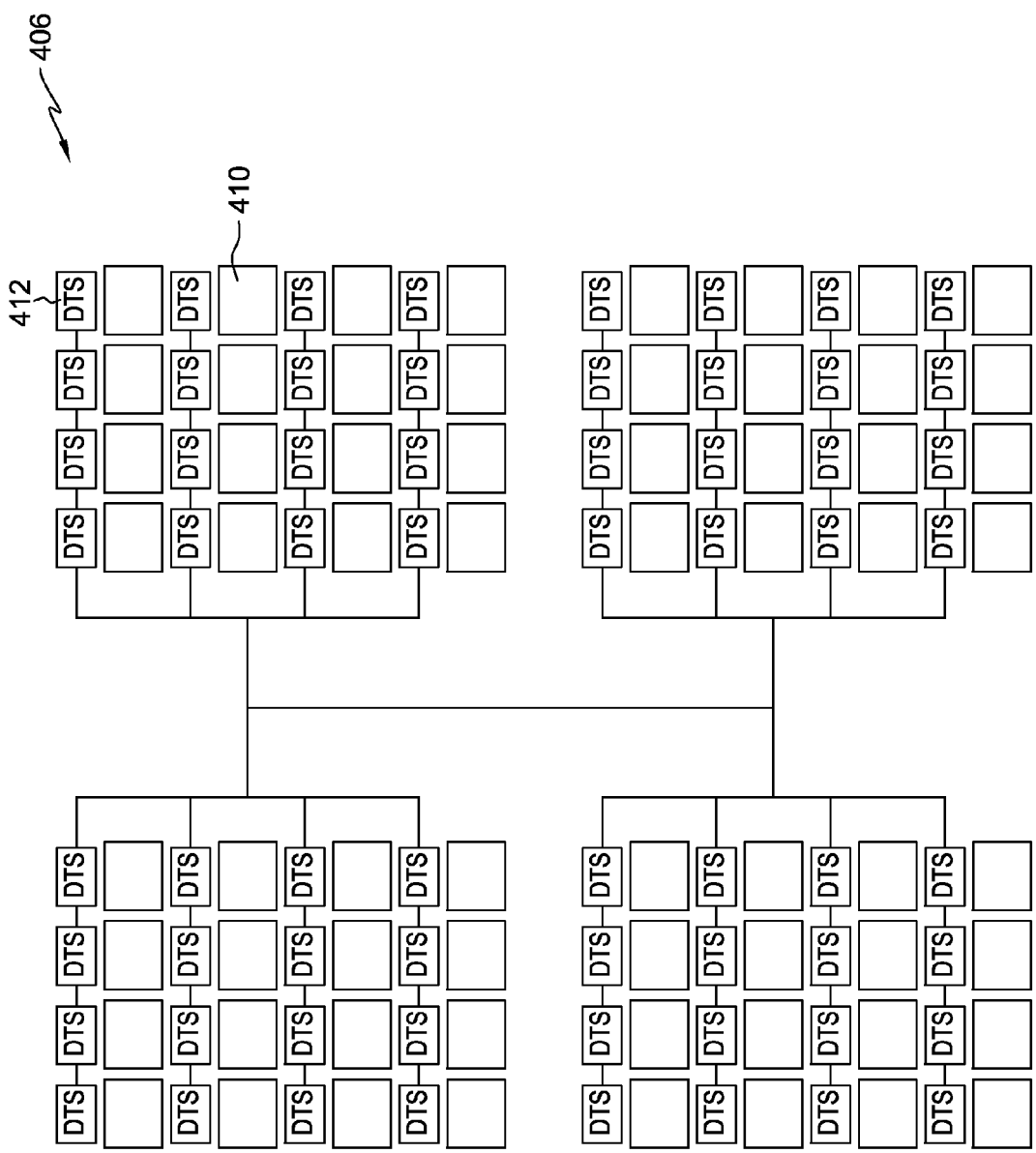
FIG. 5 is an expanded view of PCM memory regions in the hardware environment of FIG. 4.

It may be desirable to further divide the memory regions 406 into subregions. Referring to FIG. 5, one such memory region 406 is shown comprising 64 subregions 410, each of which may have its own temperature sensor 412, again which may be a digital temperature sensor. FIG. 5 illustrates that the advantages of the present invention may be obtained with both large and small blocks of memory. The size of the small and large blocks of memory are not constrained by the exemplary embodiment but would be left up to the designer to optimize the design with simulations to meet or exceed his application specifications or offer competitive advantage.

Referring back to FIG. 4, the MMU 402 further comprises the PCM stack controller 418 which may be firmware or software within the MMU 402. Control, addresses and data, represented by CAD arrow 420, are fed into the PCM stack controller 418 from a storage device such as a disk drive (not shown). In addition, high and low temperature limits 422 for WL and the TEM 424 may be provided to the PCM stack controller 418. The high and low temperature limits 422 may be determined by simulations, application performance, reliability and other specifications that may be adjustable design targets. The TEM may come from the design specification and may be derived from life, reliability and retention specifications or from design simulations. The TEM is the optimized performance, reliability and life specifications for each design.

Power 414 may be supplied to the PCM chip to power the write current regulator 416 which programs the macros 404.

Also included within the MMU is a tag array 426 which contains a thermal mapping table having entries 428 corresponding to each of the memory regions 406. For example, the top four entries 430 in the tag array 426 correspond to memory regions 432 in PCM memory macros 404. Temperatures of each of the memory regions 406 are supplied by the temperature sensors 408 to the tag array 426 and to the PCM stack controller 418. Entries 430 may be labeled as MRU because they have the highest temperatures as provided by the temperature sensors 408. If the temperatures of memory regions 432 exceed the WL temperature limits, the corresponding entries in tag array 426 may be disabled by setting a disable bit for each of the entries 430. Thus, the memory regions 432 corresponding to entries 430, if disabled in tag array 426, would temporarily not be available for programming. Other entries in the tag array 426, such as entries 434, corresponding to memory regions 436 have been labeled as PRU while other entries in the tag array 426, such as entries 438, corresponding to memory regions 440 have been labeled as LRU.

When data 442 is desired to be programmed into PCM memory macros 404, the temperatures of each of the memory regions 406 are sensed by temperature sensors 408 and provided to the tag array 426 and PCM stack controller 418. The PCM stack controller 418 may further include a macro address enable 448 function which may reduce overhead on software and firmware algorithms by allowing MRU units to be considered "off limits" or hard wired to not be able to override so that an entire table of MRU, PRU and LRU tag need not be evaluated for each write. Each of the memory regions 406 is evaluated by the PCM stack controller 418 according to the process flow in FIG. 2, if WL is not used, or in FIG. 3 if WL is used. If a memory region 406 has been disabled in tag array 426, it need not be considered in the evaluation. Those memory regions 406 having entries in the tag array 426 and are labeled as PRU (such as memory regions 436) are preferred for memory assignment followed by the memory regions 406 having entries in the tag array 426 and are labeled as LRU (such as memory regions 440). The memory regions labeled as PRU are preferred because they are warmer and require less current to program than the memory regions labeled as LRU.

When the memory regions 406 have been evaluated and a memory region 406 is chosen for assignment, the macro address of the original memory regions is swapped 444 for the alternative memory region. Data would then be written to the alternative memory region. For example, one of the PRU memory regions 436 may be swapped for one of the MRU memory regions 432 and then the MRU memory region 432 may be disabled. After a period of time, the disabled MRU memory region 432 may be sufficiently cooled so that the PCM stack controller 418 resets the disable bit in the MRU memory region 432 so that the formerly MRU memory region 432 (it may now be a PRU macro or LRU macro) may now be enabled for memory assignment.

It is thus seen that by disabling the MRU memory regions as they get too warm, WL is accomplished by avoiding repeatedly writing to the same blocks of memory.

As will be appreciated by one skilled in the art, aspects of the exemplary embodiments may be embodied as a system, method, service method or computer program product. Accordingly, aspects of the exemplary embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the exemplary embodiments may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible and non-transitory medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the exemplary embodiments may be written in any combination of one or more programming languages, including an object oriented programming language such as Java, Smalltalk, C++ or the like and conventional procedural programming languages, such as the "C" programming language or similar programming languages or even Microsoft Excel/Access. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the exemplary embodiments have been described above with reference to flowchart illustrations and/or block diagrams of methods, apparatus (systems) and computer program products according to the exemplary embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and/or block diagrams in the Figures illustrate the architecture, functionality, and operation of possible implementations of systems, methods, service methods and computer program products according to the exemplary embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A three dimensional (3D) stack of phase change memory (PCM) devices comprising:
   a plurality of PCM devices stacked in a 3D array, the plurality of PCM devices having a plurality of memory regions;
   a memory management unit on at least one of the PCM devices; and
   a stack controller in the memory management unit to monitor an ambient device temperature ($T_{ambient}$) with respect to a neighborhood of memory regions in the PCM devices and to adjust a programming current with respect to at least one of the memory regions in the neighborhood of memory regions in accordance with the $T_{ambient}$ wherein the programming current is proportional to $T_{melt} - T_{ambient}$ where $T_{melt}$ is the temperature at which a material comprising the PCM device converts from crystalline to amorphous or from amorphous to crystalline.

2. The 3D stack of PCM devices of claim 1 wherein the stack controller further includes a thermal efficiency metric that is equal to $T_{melt} - T_{ambient}$ where $T_{melt}$ is the temperature at which a material comprising the PCM device converts from crystalline to amorphous or from amorphous to crystalline, the stack controller using the thermal efficiency metric to determine the memory region to program.

3. A three dimensional (3D) stack of phase change memory (PCM) devices comprising:
   a plurality of PCM devices stacked in a 3D array, the plurality of PCM devices having a plurality of memory regions;
   a plurality of temperature sensors associated with the plurality of memory regions;
   a memory management unit on at least one of the PCM devices to program the plurality of memory regions; and
   a stack controller in the memory management unit to monitor an ambient device temperature ($T_{ambient}$) provided by at least one of the temperature sensors associated with one of the plurality of memory regions and to adjust a programming current in the memory management unit with respect to the one of the plurality of memory regions in accordance with the $T_{ambient}$ provided by the at least one of the temperature sensors wherein the programming current is proportional to $T_{melt} - T_{ambient}$ where $T_{melt}$ is the temperature at which a material comprising the PCM device converts from crystalline to amorphous or from amorphous to crystalline.

4. The 3D stack of PCM devices of claim 3 wherein the stack controller further includes a thermal efficiency metric that is equal to $T_{melt} - T_{ambient}$ where $T_{melt}$ is the temperature at which a material comprising the PCM device converts from crystalline to amorphous or from amorphous to crystalline, the stack controller using the thermal efficiency metric to determine the memory region to program.

5. A three dimensional (3D) stack of phase change memory (PCM) devices comprising:
   a plurality of PCM devices stacked in a 3D array, the plurality of PCM devices having a plurality of memory regions;
   a plurality of temperature sensors associated with the plurality of memory regions;
   a memory management unit on at least one of the PCM devices to program the plurality of memory regions, the memory management unit further comprising a thermal map tag array table, the tag array table comprising a plurality of entries corresponding to the plurality of memory regions, each of the plurality of entries having a designation indicating whether it is a most recently used (MRU) memory region, a partially recently used (PRU) region or a least recently used (LRU) memory region, such designation being indicative of the $T_{ambient}$ of the memory region corresponding to the entry: and
   a stack controller in the memory management unit to monitor an ambient device temperature ($T_{ambient}$) provided by at least one of the temperature sensors associated with one of the plurality of memory regions and to adjust a programming current in the memory management unit with respect to the one of the plurality of memory regions in accordance with the $T_{ambient}$ provided by the at least one of the temperature sensors.

6. The 3D stack of PCM devices of claim 5 wherein when the memory management unit programs the plurality of memory regions, the memory management unit programs a PRU region or an LRU memory region.

7. The 3D stack of PCM devices of claim 5 wherein the stack controller further comprises a wear leveling high and low temperature limit such that if a memory region has a temperature exceeding the high temperature wear leveling limit, the memory region exceeding the high temperature wear leveling limit is temporarily disabled such that it cannot be programmed.

8. The 3D stack of PCM devices of claim 3 wherein the stack controller further comprises a wear leveling high and low temperature limit such that if a memory region has a temperature exceeding the high temperature wear leveling limit, the memory region exceeding the high temperature wear leveling limit is temporarily disabled such that it cannot be programmed.

9. A phase change memory (PCM) device comprising:
   a PCM device having a plurality of memory regions;
   a memory management unit on the PCM device; and
   a stack controller in the memory management unit to monitor an ambient device temperature ($T_{ambient}$) with respect to a neighborhood of memory regions in the PCM device and to adjust a programming current with respect to at least one of the memory regions in the neighborhood of memory regions in accordance with the $T_{ambient}$ wherein the programming current is proportional to $T_{melt} - T_{ambient}$ where $T_{melt}$ is the temperature at which a material comprising the PCM device converts from crystalline to amorphous or from amorphous to crystalline.

10. A phase change memory (PCM) device comprising:
    a PCM device having a plurality of memory regions;
    a memory management unit on the PCM device; and a stack controller in the memory management unit to monitor an ambient device temperature ($T_{ambient}$) with respect to a neighborhood of memory regions in the PCM device and to adjust a programming current with respect to at least one of the memory regions in the neighborhood of memory regions in accordance with the $T_{ambient}$, wherein the stack controller further includes a thermal efficiency metric that is equal to $T_{melt}-T_{ambient}$ where $T_{melt}$ is the temperature at which a material comprising the PCM device converts from crystalline to amorphous or from amorphous to crystalline, the stack controller using the thermal efficiency metric to determine the memory region to program.

11. The PCM device of claim 9 further comprising a plurality of temperature sensors associated with the plurality of memory regions wherein $T_{ambient}$ being provided to the stack controller by at least one of the plurality of temperature sensors.

12. A phase change memory (PCM) device comprising:
a PCM device having a plurality of memory regions;
a memory management unit on the PCM device; and
a stack controller in the memory management unit to monitor an ambient device temperature ($T_{ambient}$) with respect to a neighborhood of memory regions in the PCM device and to adjust a programming current with respect to at least one of the memory regions in the neighborhood of memory regions in accordance with the $T_{ambient}$ werein the stack controller further comprises a wear leveling high and low temperature limit such that if a memory region has a temperature exceeding the high temperature wear leveling limit, the memory region exceeding the high temperature wear leveling limit is temporarily disabled such that it cannot be programmed.

13. A method of programming a phase change memory (PCM) device within a three dimensional (3D) stack of PCM devices having a stack controller comprising:
monitoring an ambient device temperature ($T_{ambient}$) by the stack controller in a first PCM device;
monitoring $T_{ambient}$ by the stack controller in second PCM devices, the second PCM devices being neighbors of the first PCM device; and
programming by the stack controller one of the second PCM devices having $T_{ambient}$ higher than the $T_{ambient}$ of the first PCM device such that a programming current is adjusted according to the $T_{ambient}$ of the one of the second PCM devices,
wherein the method may be performed by one or more computing devices.

14. The method of claim 13 wherein the programming current is proportional to $T_{melt}-T_{ambient}$ where $T_{melt}$ is the temperature at which a material comprising the PCM device converts from crystalline to amorphous or from amorphous to crystalline.

15. The method of claim 13 wherein the first PCM device and the second PCM devices are memory regions on a plurality of PCM chips that are stacked to form a 3D stack of PCM chips.

16. A method of programming a phase change memory (PCM) device within a three dimensional (3D) stack of PCM devices having a stack controller comprising:
monitoring by the stack controller an ambient device temperature ($T_{ambient}$) in a first PCM device;
determining a thermal efficiency metric (TEM) for the first PCM device, wherein the thermal efficiency metric is equal to $T_{melt}-T_{ambient}$ where $T_{melt}$ is the temperature at which a material comprising the PCM device converts from crystalline to amorphous or from amorphous to crystalline;
monitoring by the stack controller $T_{ambient}$ in second PCM devices, the second PCM devices being neighbors of the first PCM device;
determining a heat flow path for the second PCM devices, wherein the heat flow path is the direction of heat flow among the second PCM devices;
determining a TEM for each of the second PCM devices in the heat flow path;
choosing one of the second PCM devices having a TEM less than the TEM of the first PCM device; and
programming by the stack controller the one of the second PCM devices such that a programming current is adjusted according to the TEM of the one of the second PCM devices,
wherein the method may be performed by one or more computing devices.

17. The method of claim 16 wherein the first PCM device and the second PCM devices are memory regions on a plurality of PCM chips that are stacked to form a 3D stack of PCM chips.

18. The method of claim 16 wherein the 3D stack of PCM devices further comprises a plurality of temperature sensors, wherein monitoring by the stack controller $T_{ambient}$ in a first PCM device comprises determining $T_{ambient}$ by a temperature sensor associated with the first PCM device and providing $T_{ambient}$ to the stack controller and wherein monitoring by the stack controller $T_{ambient}$ in second PCM memory devices comprises determining $T_{ambient}$ by a temperature sensor associated with each of the second PCM device and providing $T_{ambient}$ for each of the second PCM devices to the stack controller.

19. The method of claim 16 further comprising providing a wear leveling temperature limit to the stack controller and between the steps of choosing and programming, determining if $T_{ambient}$ of the one of the second PCM devices is less than the wear leveling temperature limit and if so, programming the one of the second PCM devices.

* * * * *